(12) United States Patent
Verschuren et al.

(10) Patent No.: US 9,748,522 B2
(45) Date of Patent: Aug. 29, 2017

(54) ILLUMINATION SYSTEM COMPRISING BEAM SHAPING ELEMENT

(75) Inventors: Coen Adrianus Verschuren, Eindhoven (NL); Ferry Zijp, Nuenen (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 657 days.

(21) Appl. No.: 13/265,282

(22) PCT Filed: Apr. 21, 2010

(86) PCT No.: PCT/IB2010/051749
§ 371 (c)(1),
(2), (4) Date: Oct. 19, 2011

(87) PCT Pub. No.: WO2010/122507
PCT Pub. Date: Oct. 28, 2010

(65) Prior Publication Data
US 2012/0037943 A1 Feb. 16, 2012

(30) Foreign Application Priority Data

Apr. 24, 2009 (EP) ...................................... 09158685

(51) Int. Cl.
*H01L 33/00* (2010.01)
*H01L 51/52* (2006.01)
(Continued)

(52) U.S. Cl.
CPC .......... *H01L 51/5268* (2013.01); *B82Y 20/00* (2013.01); *B82Y 30/00* (2013.01);
(Continued)

(58) Field of Classification Search
None
See application file for complete search history.

(56) References Cited

U.S. PATENT DOCUMENTS 7,602,118 B2 * 10/2009 Cok et al. ...................... 313/506
8,008,694 B2 *  8/2011 Xu .......................... H01L 33/44
257/290
(Continued)

FOREIGN PATENT DOCUMENTS

WO         0237580 A1    5/2002
WO     2005083317 A1    9/2005
(Continued)

*Primary Examiner* — Matthew Landau
*Assistant Examiner* — Priya Rampersaud (57) ABSTRACT

The invention relates to an illumination system comprising a light emitting device and a beam shaping element for generating an angular distribution of the light emitted from the illumination system. The beam shaping element is configured for recycling at least a part of the light emitted from a light emitting surface of the light emitting device via reflection back towards the light emitting surface. The illumination system further comprises a diffuser arranged substantially parallel to the light emitting surface for diffusing at least part of the recycled light. The diffuser is constituted of a translucent diffuser and/or a diffusely reflective electrode layer of the light emitting device. Limiting the angular distribution by recycling light, using the beam shaping element for recycling light via reflection, reduces glare when the illumination system is used in general lighting applications. The diffuser avoids that the recycled light is confined between the beam shaping element and the light emitting surface of the light emitting element. The recycling is preferably done via total internal reflection at the beam shaping element. The presence of the diffuser improves the efficiency of the illumination system.

9 Claims, 3 Drawing Sheets (51) Int. Cl.
    *B82Y 20/00*     (2011.01)
    *B82Y 30/00*     (2011.01)
    *G02F 1/1335*     (2006.01)
    *F21Y 105/00*     (2016.01)
    *F21Y 115/15*     (2016.01)

(52) U.S. Cl.
    CPC .... *G02F 1/133606* (2013.01); *H01L 51/5275* (2013.01); *F21Y 2105/00* (2013.01); *F21Y 2115/15* (2016.08); *G02F 1/133603* (2013.01); *G02F 2001/133607* (2013.01); *G02F 2203/023* (2013.01); *H01L 2251/5361* (2013.01); *H01L 2251/5369* (2013.01)

(56) References Cited

U.S. PATENT DOCUMENTS

| | | | |
|---|---|---|---|
| 2007/0291491 A1 | 12/2007 | Li et al. | |
| 2008/0128727 A1* | 6/2008 | Erchak et al. | 257/98 |
| 2009/0015757 A1 | 1/2009 | Potts et al. | |
| 2010/0012956 A1* | 1/2010 | Yoo | H01L 33/32 257/94 |

FOREIGN PATENT DOCUMENTS

| | | |
|---|---|---|
| WO | 2006035391 A1 | 4/2006 |
| WO | 2008044170 A2 | 4/2008 |
| WO | 2008138156 A1 | 11/2008 |

\* cited by examiner

ILLUMINATION SYSTEM COMPRISING BEAM SHAPING ELEMENT

FIELD OF THE INVENTION

The invention relates to an illumination system comprising a light emitting device and a beam shaping element.

The invention also relates to an organic light emitting diode device for use in the illumination system according to the invention.

BACKGROUND OF THE INVENTION

Illumination systems are known per se. They are used, inter alia, in luminaires for general lighting purposes, for example, for office lights, shop lights or, for example, shop window lights. Alternatively these illumination systems may be used for illuminating advertising boards, for example, advertising boards illuminating a partially transparent image from the back of the image.

The known illumination systems may also be used as light sources in backlighting systems in (picture) display devices, for example, for TV sets and monitors. Such illumination systems are particularly suitable for use as backlighting systems for non-emissive displays such as liquid crystal display devices, also denoted as LCD panels, which are used in (portable) computers or (portable) telephones.

Organic light emitting diode devices (further also indicated as OLED devices) are in many ways considered as the future in various lighting applications. They may, for instance, be used to create ambient lighting which is emitted from relatively large light emitting surfaces. In addition to high efficiency, such large area light emitters also provide interesting design possibilities to design general lighting systems. A drawback of such OLED devices is that the angular distribution of the light emitted from a light emitting surface of the OLED device is substantially Lambertian, which may cause glare when used in general lighting systems. Glare results from excessive contrast between bright and dark areas in the field of view. Glare can, for example, result from directly viewing a filament of an unshielded or badly shielded light source. To prevent glare, a normalized emission profile is defined in, for example, the European Standard EN12464-1 which dictates that the emission of light should be cut off at emission angles exceeding 60 degrees when the lamp luminance exceeds 500 kcd/m$^2$. Similar standards apply in other regions. Since the OLED device has a relatively large light emitting surface from which light is emitted having a substantially Lambertian emission distribution, the shaping of the emitted light to comply with the normalized emission profile while maintaining a relatively high efficiency is relatively difficult.

SUMMARY OF THE INVENTION

Consequently, it is an object of the invention to provide an illumination system in which the angular distribution of the emitted light is limited while the efficiency of the illumination system is maintained relatively high.

The illumination system according to the first aspect of the invention comprises a light emitting device and a beam shaping element for generating an angular distribution of the light emitted from the illumination system, the beam shaping element being configured for recycling at least a part of the light emitted from a light emitting surface of the light emitting device via reflection back towards the light emitting surface, the illumination system further comprising a diffuser arranged substantially parallel to the light emitting surface for diffusing at least part of the recycled light, the diffuser being constituted of a translucent diffuser and/or a diffusely reflective electrode layer of the light emitting device.

An effect of the illumination system according to the invention is that the diffusion of the recycled light via the diffuser causes a major part of the recycled light to have only a small and limited number of reflections when being recycled, after which the recycled light still is emitted from the illumination system, which ensures that the efficiency of the illumination system remains high, while the angular distribution of the light emitted from the illumination system remains limited. In the remainder of the document efficiency means energy efficiency. Preferably, the recycled light is recycled via total internal reflection. However, due to the presence of angle selective reflection, the part of the light which is reflected from the beam shaping element typically is captured between the beam shaping element and the light emitting surface of the light emitting device. After multiple reflections most of this captured light is lost, typically due to re-absorption at the light emitting device. In the illumination system according to the invention the illumination system further comprises a diffuser which is configured for diffusing at least a part of the recycled light. Due to the fact that at least a part of the recycled light is diffused, the propagation direction of this part of the recycled light is altered and thus may escape being confined between the beam shaping element and the light emitting device. Thus, due to the presence of the diffuser, part of the recycled light still may be emitted after reflection from the light emitting device. The limitation of the angular distribution is generated by the beam shaping element. Such beam shaping elements are known in the art and may, for example, generate a light distribution via topographical structures on the beam shaping element, and/or via holographic structures on the beam shaping element, and/or via anisotropic scattering elements in the beam shaping element. A well known beam shaping element is, for example, a so called MLO element, which stands for micro-lens optical element in which the beam shaping element is constituted of an array of truncated pyramidal or conical structures of which the truncated part is curved inward into the individual pyramidal or conical structures. Such an MLO element as beam shaping element generates a light distribution via recycling part of the light substantially via total internal reflection inside the pyramidal or conical structures, thus obtaining a very efficient beam shaping. When using such beam shaping elements in, for example, organic light emitting diodes, the recycled light may be confined between the beam shaping element and the light emission surface of the organic light emitting diode. As the surface of organic light emitting diodes is relatively large, this confinement will typically cause the recycled light to reflect back and forth between the beam shaping element and the organic light emitting diode until the recycled light is absorbed, for example, in the organic light emitting diode and thus lost. To further improve the efficiency when using such an MLO element as beam shaping element, the confinement of the recycled light between the beam shaping element and the light emitting device must be prevented. This is achieved by using the diffuser according to the current invention. The diffuser will alter the direction of a major part of the recycled light, preventing the confinement of the re-directed light and allowing this re-directed light to be emitted from the illumination system via the beam shaping element within the generated light distribution.

Thus, the efficiency of the illumination system when using well known beam shaping elements is further improved.

The use of a translucent diffuser and/or a diffusely reflective electrode layer, arranged substantially parallel to the light emitting surface has the benefit that efficient diffusion of the light is obtained when using light emitting devices having relatively large light emission surfaces.

In an embodiment of the illumination system, the light emitting device is an organic light emitting diode device. A major benefit of organic light emitting diode devices is that these devices typically have a relatively large light emitting surface. Furthermore, the general trend is to increase the use of organic light emitting devices in general lighting applications as these devices have an overall high efficiency allowing energy savings compared to conventional illumination systems based on incandescent light sources or discharge lamps. However, due to the relatively large light emitting surfaces and due to the typical Lambertian emission profile of light from these light emitting surfaces, plain application of these organic light emitting diode devices in general lighting applications would cause glare. Furthermore, known optical modules which collimate the emitted light within a predefined angular distribution are not designed for light sources having a relatively large light emitting surface. Using the beam shaping element according to the invention allows defining a specific angular distribution for light emitters having a relatively large light emitting surface while maintaining good efficiency.

In an embodiment of the illumination system, a dimension of the diffuser parallel to the light emitting surface is substantially equal to the dimensions of the light emitting surface. Since confinement of the light between the beam shaping element and the light emitting device must be prevented, by choosing the dimensions of the diffuser parallel to the light emitting surface to substantially correspond to the dimensions of the light emitting surface, substantially all recycled light has to traverse through the diffuser, ensuring that the loss of light due to confinement is minimal.

In an embodiment of the illumination system, the translucent diffuser is applied on a diffusing surface in the illumination system. Generally, the illumination systems comprising organic light emitting diode devices are relatively thin. To ensure that at least a part of the reflected light is diffused, the diffuser may be a translucent diffuser applied to a surface inside the illumination system. For example, the diffusing surface is arranged parallel to the light emitting surface and may have the same dimensions as the light emitting surface of the light emitting device. Thus, not only the recycled light reflected from the beam shaping element will be diffused by the diffuser, but also the light emitted by the light emitting device will be diffused by the diffuser. However, as the translucent diffuser generally produces a forward scattering distribution and as the emission distribution from a light emitting device typically already has a near Lambertian emission distribution, the presence of the translucent diffuser for the light emitted by the light emitting device hardly changes the emission profile. There may be some additional loss due to the presence of the diffuser, however, many different diffuser materials exist which have a relatively high efficiency and which may be applied in such an illumination system without inducing too much additional loss. Furthermore, the improvement of the efficiency due to the re-emission of the recycled light exceeds the additional loss due to the diffuser.

In an embodiment of the illumination system, the diffuser comprises scattering microstructures applied to the diffusing-surface, or the diffuser comprises scattering particles and/or voids distributed in a layer applied to the diffusing surface. Scattering microstructures may be applied on a carrier plate which comprises the diffusing surface. Alternatively, the carrier plate may also comprise an additional layer which is applied to the diffusing surface and which comprises a distribution of scattering particles and/or voids.

In an embodiment of the illumination system, the translucent diffuser comprises a substantially forward-scattering diffuser. A substantially forward scattering diffuser scatters the impinging light such that the deflected light propagates in a direction that is substantially within 90 degrees of the direction of propagation of the incident light. Such a diffuser typically has a high transparency and thus represents only little light loss when applied in a light system.

In an embodiment of the illumination system, the translucent diffuser is arranged between the light emitting diode and the beam shaping element. Such an arrangement allows a relatively simple manufacturing process as the illumination system is constituted of separate layers comprising the light emitting device, the translucent diffuser and the beam shaping element. An additional benefit is that the translucent diffuser may be exchanged with a translucent diffuser having specific diffusing characteristics required for a specific purpose, thus making the illumination system more flexible to specific needs.

In an embodiment of the illumination system, the light emitting device comprises the diffuser. In such an arrangement the illumination system is constituted of fewer components and thus the manufacturing generally is less expensive. Furthermore, the height of the illumination system may be reduced due to the integration of the diffuser in the light emitting device. The height of the illumination system is a dimension of the illumination system in a direction substantially perpendicular to the light emitting surface of the light emitting device.

In an embodiment of the illumination system, a light emitting surface of the light emitting device comprises the translucent diffuser. The translucent diffuser may be applied to the light emitting surface of the light emitting device after the light emitting device has been produced in a standardized process. No special production steps have to be taken when producing the light emitting device, and after production of the light emitting device, the translucent diffuser may be applied to the light emitting surface. The translucent diffuser may, for example, be constituted of an additional layer comprising scattering particles and/or voids distributed in a layer. Alternatively, a substantially transparent layer may be applied to the light emitting surface after which a plurality of microstructures may be applied to the applied layer to cause the diffusing effect.

In an embodiment of the illumination system, the light emitting device comprises a reflecting electrode layer, the reflecting electrode layer comprising the diffuser diffusely reflecting light impinging on the reflecting electrode layer. The reflecting electrode layer, for example, is the cathode layer, for example, constituted of non-polished metal. The non-polished metal layer diffusely reflects impinging light. This impinging light may be light produced in the light emitting layer of the light emitting device which does not propagate towards the light emitting surface of the light emitting device, but in the opposite direction. The impinging light on the diffusely reflecting surface may also comprise recycled light reflected from the beam shaping element, for example, via total internal reflection. The diffusely reflecting electrode layer may constitute the diffuser for altering the propagation direction of the impinging light such that part of the scattered light is no longer confined via total internal reflection between the light emitting device and the beam shaping element and thus will contribute to the emission of light from the illumination system.

In an embodiment of the illumination system, the reflecting electrode layer comprises a plurality of deformations for diffusely reflecting impinging light. These deformations may be generated via etching during the production process of the light emitting device. Alternatively, these deformations may be generated by impinging electromagnetic radiation such as focused laser radiation. Preferably, this focused laser radiation may generate the deformations, also known as buckling, without damaging the light emitting layer of the light emitting device. This may be done via choosing a laser wavelength or laser power which does not damage the light emitting layer. However, more preferably, the laser should irradiate the reflecting electrode layer from the rear side of the light emitting device, thus avoiding that the laser beam has to propagate through the light emitting layer of the light emitting device.

In an embodiment of the illumination system, the beam shaping element comprises an array of micro-optical structures for generating an angular distribution of the light emitted from the illumination system. The MLO-element has been indicated already hereinabove as an array of micro-optical structures for generating the angular distribution of the light. However, also other structures having a similar effect and recycling part of the impinging light which is not emitted within the angular distribution may be used as the beam shaping element. Preferably, the angular distribution resulting from the beam shaping element complies with European Standard EN12464-1 for a glare-free illumination system.

In an embodiment of the illumination system, the beam shaping element further comprises extraction means for improving light extraction from the beam shaping element at the generated angular distribution. Such extraction means may, for example, comprise well known light extraction foils which are applied on the beam shaping element.

The organic light emitting diode device according to the second aspect of the invention is configured for use in an illumination system.

BRIEF DESCRIPTION OF THE DRAWINGS

These and other aspects of the invention are apparent from and will be elucidated with reference to the embodiments described hereinafter.

In the drawings.

The Figures are purely diagrammatic and not drawn to scale. Particularly for clarity, some dimensions are exaggerated strongly. Similar components in the Figures are denoted by the same reference numerals as much as possible.

DETAILED DESCRIPTION OF EMBODIMENTS

Figure 1:
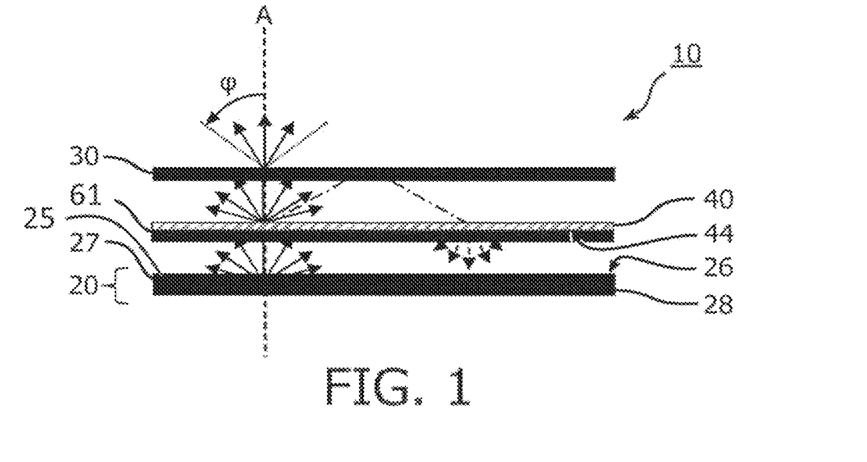
FIG. 1 shows a schematic cross-sectional view of a first embodiment of the illumination system according to the invention.
Figures 5A, 5B:
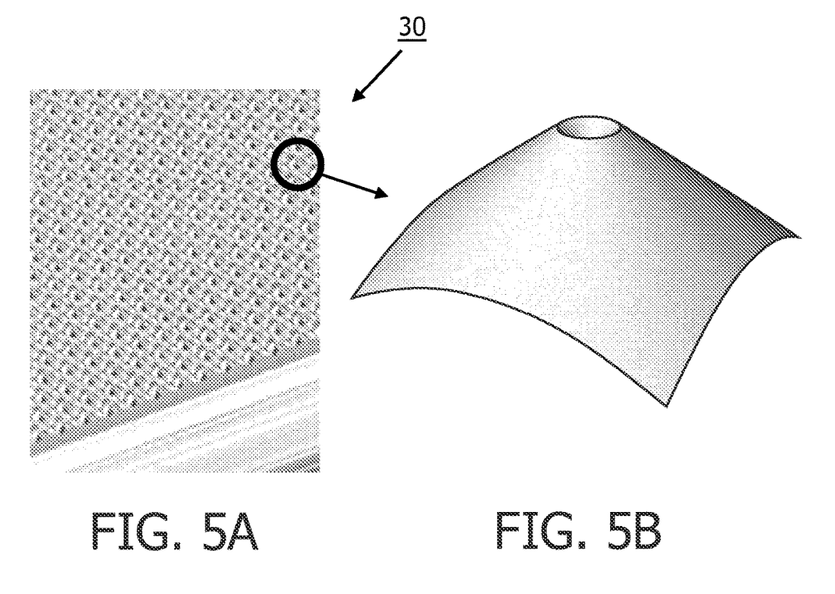
FIGS. 5A and 5B shows a generic and a detailed illustration, respectively, of a known micro-lens optical structure which may be used as beam shaping element in the illumination system according to the invention.

FIG. 1 shows a schematic cross-sectional view of a first embodiment 10 of the illumination system 10 according to the invention. The illumination system 10 as shown in FIG. 1 comprises a light emitting device 20, preferably an organic light emitting diode device 20. The illumination system 10 as shown in FIG. 1 further comprises a beam shaping element 30 for generating an angular distribution $\phi$ of the light emitted by the light emitting device 20. The beam shaping element 30 may, for example, comprise a micro-lens optical element 30 as is shown in FIGS. 5A and 5B, but may also comprise other beam shaping elements 30. The beam shaping element 30 is configured for recycling part of the light back to the light emitting device 20. Preferably, this recycling is based on total internal reflection inside the topographical structure of the beam shaping element 30, as this would result in a substantially loss-less reflection of the recycled light which would substantially optimize the efficiency of the beam shaping element 30. In the embodiment shown in FIG. 1, the illumination system 10 further comprises a translucent diffuser 40 arranged on a substrate 61. The substrate 61 may be constituted of any material substantially transparent to the wavelength of the light generated by the light emitting device to avoid loss of light through the substrate 61. On the substrate 61 the translucent diffuser 40 is arranged, preferably at a surface 44 of the substrate 61. The translucent diffuser 40 may be constituted of micro-scratches or other roughnesses on the surface 44 of the substrate 61 or may be constituted of scattering material and/or voids distributed in a carrier material 40 or a micro-optical refracting structure. Alternatively, the scattering material may be distributed inside the substrate 61 (not shown) and thus may generate a self-supporting diffuser.

The illumination system 10 according to the invention operates as a glare limiting illumination system 10 in which the beam shaping element 30 limits the angular distribution $\phi$ of the light emitted from the illumination system 10. After choosing a specific beam shaping element 30, the angular distribution $\phi$ may be chosen, for example, such that the resulting angular distribution $\phi$ complies with European Standard EN12464-1 defining that the angular distribution $\phi$ emitted from the illumination system 10 should remain within ±60 degrees with respect to a normal axis A to the emission window of the illumination system 10. For other applications smaller or larger cut-off angles may be chosen.

The light emitting device 20, typically being an organic light emitting diode device 20, has a relatively large light emitting surface 26 and substantially every point on this light emitting surface 26 emits light in a substantially Lambertian light distribution (indicated with the plurality of arrows originating from the light emitting device 20 in FIG. 1). Due to this substantially Lambertian light distribution, light is also emitted across the whole light emitting surface 26 at angles exceeding ±60 degrees, thereby causing glare when used in general lighting systems. There are, of course, glare reducing optics, however they are typically designed for relatively small light sources emitting light in substantially all directions, such as discharge lamps, incandescent lamps and light emitting diodes. However, since the organic light emitting diodes 20 generally have relatively large light emission surfaces 26, these known glare reducing measures will not work efficiently in systems having a similar size as the organic light emitting devices. Furthermore, one characteristic of the organic light emitting diode devices 20 is that they have relatively high efficiency. The known glare reducing measures typically remove much of the light via multiple reflections and finally absorption, such that the cut-off part of the light to obtain the required angular distribution φ significantly reduces the efficiency of the illumination system 10. Due to the beam shaping element 30—preferably based on total internal reflection—together with the translucent diffuser 40, a very efficient limitation of the angular distribution φ of the illumination system 10 is obtained across the whole light emitting surface 26.

The organic light emitting diode device 20 emits light across the whole light emitting surface 26. The substantial Lambertian distribution reaches beam shaping element 30 which recycles part of the impinging light back towards the organic light emitting diode device 20. As explained before, this recycling is preferably done via total internal reflection. This recycled light would normally be trapped inside the illumination system 10 as it would continue to bounce between the beam shaping element 30 and the organic light emitting diode device 20. However, in the illumination system 10 according to the invention, the translucent diffuser 40 is present in the illumination system 10 to diffuse the recycled light (indicated with a plurality of dash-dotted arrows originating from the translucent diffuser 40 and extending in the direction of the organic light emitting diode 20 in FIG. 1). Due to this diffusing of the recycled light, the propagation direction of most of the diffused light is altered, causing the diffused light not to be confined between beam shaping element 30 and the organic light emitting diode device 20, allowing the diffused light to be emitted from the illumination system after reflection from the organic light emitting diode device 20.

In the arrangement as shown in FIG. 1, the translucent diffuser 40 is arranged between the organic light emitting diode device 20 and the beam shaping element 30. Therefore, all light generated by the organic light emitting diode device 20 is also diffused by the diffuser 40 before it strikes the beam shaping element 30 (indicated with a plurality of arrows originating from the translucent diffuser 40 and extending in a direction of the beam shaping element 30 in FIG. 1). However, as the light emitted by the organic light emitting diode device 20 is already substantially Lambertian, the presence of the translucent diffuser 40 does not alter the emission profile of the light emitted by the organic light emitting diode device 20. On the other hand the light reflected from the beam shaping element 30 and recycled back into the illumination system 10 is reflected at an angle equal to or larger than the critical angle and as such will remain captured between the beam shaping element 30 and the organic light emitting diode device 20 and after several reflections would be fully extinguished due to absorption at, for example, the light emitting layer 27 of the organic light emitting diode device 20.

Preferably, the translucent diffuser 40 is a so called "forward diffuser". A forward diffuser has a relatively high level of transmission of light and is configured for diffusing the impinging light such that the deflected light propagates in a direction that is substantially within 90° of the direction of propagation of the incident light.

The light emitting layer 27 of the organic light emitting diode device 20 is typically arranged between an anode layer 25 and a cathode layer 28. Generally, the cathode layer 28 is constituted of a highly reflecting layer 28 to enable good reflection of the light recycled back towards the beam shaping element 30 and eventually emitted by the illumination system 10. The anode layer 25 typically is constituted of a transparent conductive material, for example, ITO. Of course, the organic light emitting diode device 20 may comprise additional layers (not shown) which may facilitate the efficient emission of light from the organic light emitting diode device 20.

Figure 2:
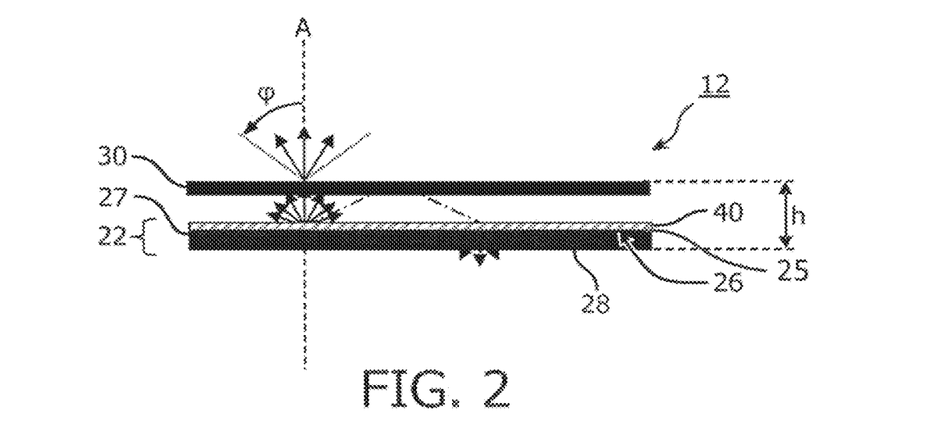
FIG. 2 shows a schematic cross-sectional view of a second embodiment of the illumination system according to the invention.

FIG. 2 shows a schematic cross-sectional view of a second embodiment 12 of the illumination system 12 according to the invention. In the embodiment shown in FIG. 2, the translucent diffuser 40 is arranged on top of the organic light emitting diode device 22. In such a configuration, no additional diffuser 40 has to be placed between the beam shaping element 30 and the organic light emitting diode device 20 as was the case in the embodiment shown in FIG. 1. As such, a simpler construction of the illumination system 12 is obtained which may lead to cost reduction. Also in the configuration shown in FIG. 2, the translucent diffuser 40 may be constituted of micro-scratches arranged on the light emitting surface 26 of the organic light emitting diode device 22, or may be constituted of a layer comprising a distribution of scattering material and/or voids constituting the translucent diffuser 40. Also in such a configuration the light originally generated in the light emitting layer 27 of the organic light emitting diode 22 will be diffused by the translucent diffuser 40. However, as explained above, this would not alter the effect obtained by the beam shaping element 30, which recycles light due to the angle of incidence of the light impinging on the beam shaping element 30. Cost reduction as fewer components have to be assembled, and a reduced height h of the illumination system 12 may be achieved by the illumination system as shown in FIG. 2 compared to the illumination system as shown in FIG. 1. The height h of the illumination system 12 is defined as being measured in a direction substantially perpendicular to the organic light emitting diode device 22. As can be seen from FIG. 2, a limitation of the angular distribution φ is obtained due to the presence of the beam shaping element 30, while the presence of the translucent diffuser 40 ensures that the efficiency of the illumination system 12 remains relatively high.

Figure 3:
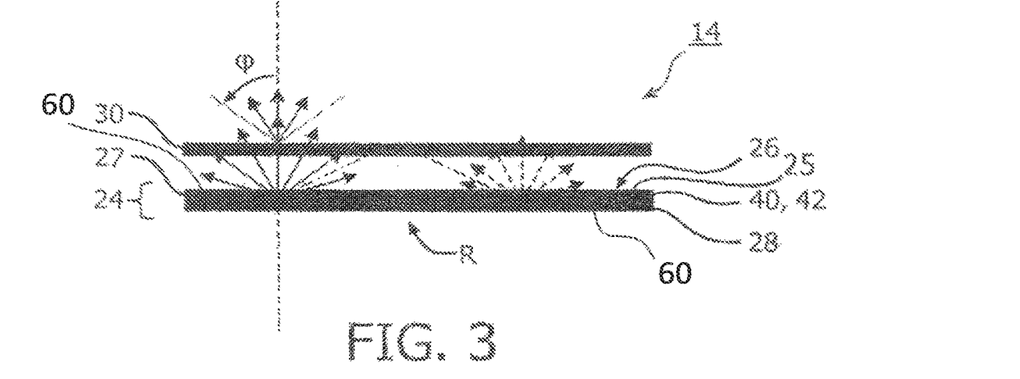
FIG. 3 shows a schematic cross-sectional view of a third embodiment of the illumination system according to the invention.

FIG. 3 shows a schematic cross-sectional view of a third embodiment 14 of the illumination system 14 according to the invention. In the embodiment shown in FIG. 3, the reflective electrode layer 28 comprises the diffuser 40, 42. The diffuser 40, 42 may be the earlier explained translucent diffuser 40 applied on top of the reflective electrode layer 28. Alternatively, the diffuser 40, 42 may be a pattern 60 applied on the reflective electrode layer 28, constituting the diffusely reflective electrode layer 42. The pattern 60 may be constituted of micro-scratches or a micro-optical refracting structure or other roughness of the reflective surface of the reflective electrode layer 28. Alternatively, relatively novel methods of generating the pattern 60 may be used by Laser-induced buckling, which locally deforms the reflective electrode layer 28 via laser irradiation, while the reflectivity of the reflecting electrode layer 28 is not altered. To avoid damage to the light emitting layer 27 of the organic light emitting diode device 24, the laser radiation is preferably applied to a rear side of the organic light emitting diode device 24 indicated with the reference sign R. Then, the light generated in the light emitting layer 27 of the organic light emitting diode device 24 is emitted towards the beam shaping element 30. A part of the light will be recycled back towards the organic light emitting diode device 24. The reflected light will again be partially transmitted through the light emitting layer 27 of the organic light emitting diode device 24 and subsequently reach the reflective electrode layer 28. As this reflective electrode layer 28 comprises the pattern 60, at least a part of the impinging light will be scattered by the pattern 60 and will be reflected again towards the beam shaping element 30 and subsequently may be transmitted by the beam shaping element 30 within the limited angular distribution ϕ due to diffuse reflection at the reflecting electrode layer 28 having the deformations 60. The diffuser 42 is arranged between the reflective electrode layer 28 of the light emitting device 24 and the beam shaping element 30.

A further benefit when using the Laser-induced pattern 60 is that the diffusing characteristic may relatively easily be influenced locally by locally varying the pattern 60. The pattern 60 constituted of deformations may even represent an image or logo or text or an otherwise recognizable pattern 60. This may cause intensity variations across the light emission surface of the illumination system 14, as at the locations of the pattern 60 the emission intensity of light is increased, causing the intensity variations across the emission surface of the illumination system 14.

The deformations 60 may be generated via laser irradiation, preferably via the rear R of the organic light emitting diode device 24. The energy of the impinging laser light should be sufficient to locally wrinkle the reflective electrode layer 28, which is also known as buckling. This buckling should be done preferably without damaging the reflective electrode layer 28, as damage would result in absorption areas in the reflective electrode layer 28 which would reduce the efficiency. Furthermore, damaging the reflective electrode layer 28 would cause the organic light emitting diode device 24 not to emit light at the damaged areas, thereby further reducing the efficiency.

Figure 4:
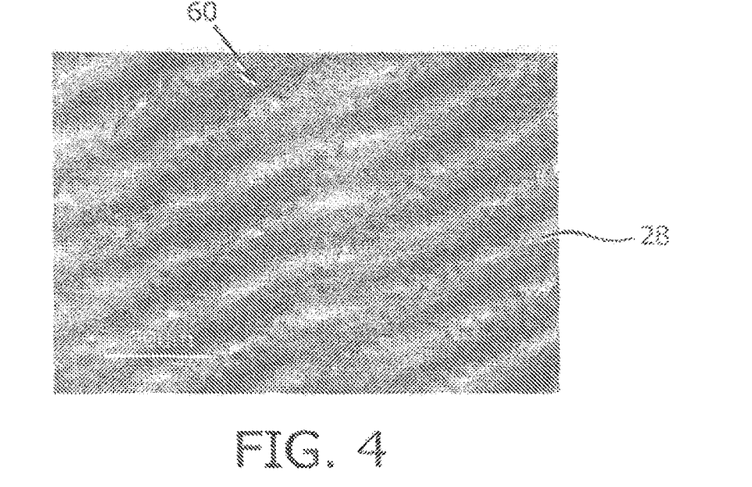
FIG. 4 shows a detailed view of a deformation applied to the reflecting electrode layer for generating a diffusely reflecting surface.

FIG. 4 shows a detailed view of deformations 60 applied to the reflecting electrode layer 28 for generating a diffusely reflecting surface 42. By altering a density of the deformations 60, the diffusing characteristics of the diffusely reflecting surface 42 may be altered. As mentioned before, the local deformations may also constitute a pattern representing an image, or, for example, text, or, for example, a logo.

FIGS. 5A and 5B shows a generic and a detailed illustration, respectively, of a known micro-lens optical structure 30, which may be used as beam shaping element 30 in the illumination system 10, 12, 14 according to the invention. The embodiment of the beam shaping element 30 as shown in FIGS. 5A and 5B is constituted of an array of truncated pyramidal or conical structures (shown in FIG. 5B) of which the truncated part is curved inward into the individual pyramidal or conical structures. Such a micro-lens optical structure 30 as the beam shaping element 30 generates a light distribution via recycling part of the light substantially via total internal reflection inside the pyramidal or conical structures, thus obtaining a very efficient beam shaping. Examples of such micro-lens structures are disclosed in WO2005083317A1. The pyramidal or conical-shaped structures may, for example, cause light which impinges on a wall of the pyramidal or conical-shaped structures at an angle larger than or equal to a critical angle (not indicated in the Figure) at the specific reflection location, to be reflected via total internal reflection. This reflected light may subsequently impinge on another part of the pyramidal or conical-shaped structure and preferably be reflected back again via total internal reflection towards the light emitting device 20, 22, 24. This reflected light will subsequently be diffused via the diffuser 40, 42, after which the light typically changes its propagation direction and may, after being reflected back to the beam shaping element 30, impinge on the beam shaping element 30 at an angle which allows the impinging light to be transmitted by the beam shaping element 30 within the predefined angular distribution ϕ. When using such beam shaping elements 30 in, for example, organic light emitting diodes 20, 22, 24, the recycled light may still be confined between the beam shaping element 30 and the organic light emitting diode 20, 22, 24. The presence of the diffuser 40, 42 will reduce the confinement and thus improve the efficiency of the illumination system 10, 12, 14. Of course, other specific designs of the beam shaping element 30 may be used without departing from the scope of the invention.

Figure 6:
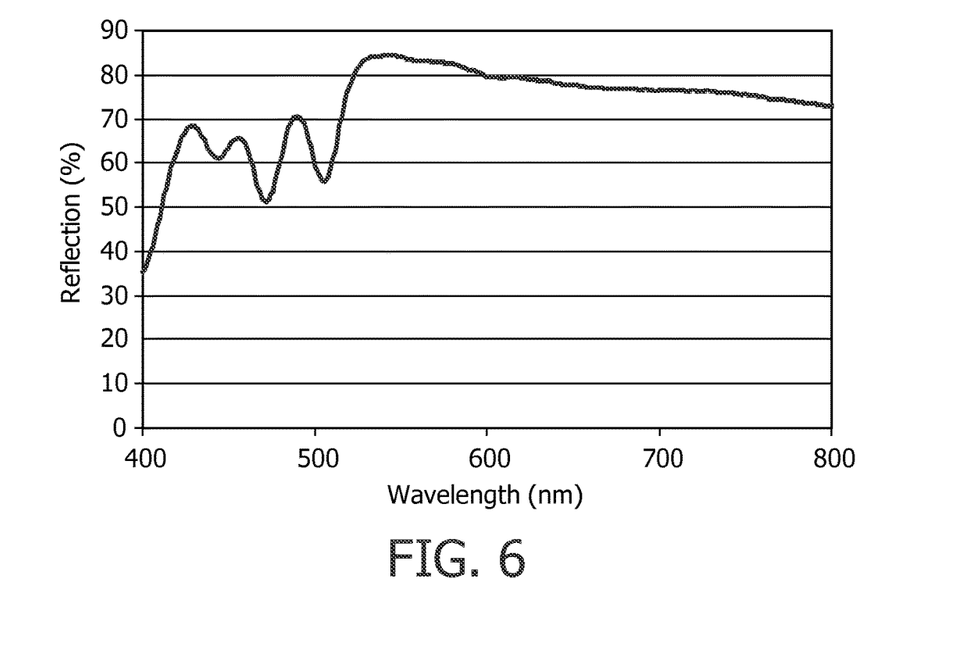
FIG. 6 shows the reflection versus wavelength for a standard white-light emitting organic light emitting diode device.

FIG. 6 shows the reflection versus wavelength for a standard white-light emitting organic light emitting diode device 20, 22, 24. As can be clearly seen, the organic light emitting diode device has a good reflectivity of visible light and may effectively be used to reflect the recycled light from the beam shaping element 30 back towards the beam shaping element 30 in another attempt (?) to be emitted from the illumination system 10, 12, 14 according to the invention.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. An illumination system comprising a light emitting device and a beam shaping element for generating an angular distribution of light emissions from the illumination system, the beam shaping element being configured for recycling, and outputting from the illumination system, at least a portion of light emitted from a light emitting surface of the light emitting device via reflection back towards the light emitting surface, the illumination system further comprising a diffuser arranged substantially parallel to the light emitting surface for diffusing at least part of the recycled light, the diffuser being a diffusely reflective bottom electrode of the light emitting device, wherein the light emitting device includes a top electrode that is disposed at or below the light emitting surface, and wherein the diffusely reflective bottom electrode is disposed below said top electrode and includes deformations at a bottom surface of the bottom electrode.

2. Illumination system as claimed in claim 1, wherein the light emitting device is an organic light emitting diode device.

3. Illumination system as claimed in claim 1, wherein a dimension of the diffuser parallel to the light emitting surface is substantially equal to the dimensions of the light emitting surface.

4. Illumination system as claimed in claim 1, wherein the diffuser comprises scattering microstructures.

5. Illumination system as claimed in claim 1, wherein the bottom electrode comprises a plurality of deformations on a top surface of the bottom electrode for diffusely reflecting impinging light.

6. Illumination system as claimed in claim 1, wherein the beam shaping element comprises an array of micro-optical structures for generating an angular distribution of the light emitted from the illumination system.

7. Illumination system as claimed in claim 1, wherein the beam shaping element further comprises light extraction foils for improving light extraction from the beam shaping element at the generated angular distribution.

8. Illumination system as claimed in claim 1, wherein the deformations comprise a pattern of deformations including locally varied areas that form a visibly recognizable image that is perceivable by a viewer of said system.

9. Illumination system as claimed in claim 8, wherein said image includes at least one of a logo or text.

* * * * *